(12) United States Patent
Chavarkar et al.

(10) Patent No.: US 6,849,882 B2
(45) Date of Patent: Feb. 1, 2005

(54) GROUP-III NITRIDE BASED HIGH ELECTRON MOBILITY TRANSISTOR (HEMT) WITH BARRIER/SPACER LAYER

(75) Inventors: Prashant Chavarkar, Goleta, CA (US); Ioulia P. Smorchkova, Redondo Beach, CA (US); Stacia Keller, Santa Barbara, CA (US); Umesh Mishra, Santa Barbara, CA (US); Wladyslaw Walukiewicz, Kensington, CA (US); Yifeng Wu, Goleta, CA (US)

(73) Assignee: Cree Inc., Goleta, CA (US)

( * ) Notice: Subject to any disclaimer, the term of this patent is extended or adjusted under 35 U.S.C. 154(b) by 59 days.

(21) Appl. No.: 10/102,272

(22) Filed: Mar. 19, 2002

(65) Prior Publication Data

US 2002/0167023 A1 Nov. 14, 2002

Related U.S. Application Data

(60) Provisional application No. 60/290,195, filed on May 11, 2001.

(51) Int. Cl.$^7$ ................ H01L 31/072; H01L 31/109
(52) U.S. Cl. ............... 257/191; 257/192; 257/194
(58) Field of Search ................ 257/191, 192, 257/194, 200

(56) References Cited

U.S. PATENT DOCUMENTS

| | | | |
|---|---|---|---|
| 5,192,987 A | 3/1993 | Khan et al. | 257/183.1 |
| 5,965,909 A | * 10/1999 | Tanaka | 257/192 |
| 6,064,082 A | 5/2000 | Kawai et al. | 257/192 |
| 6,486,502 B1 | * 11/2002 | Sheppard et al. | 257/194 |
| 6,489,628 B1 | * 12/2002 | Morizuka | 257/12 |

OTHER PUBLICATIONS

Eastman et al., "Undoped AlGaN/GaN HEMTs for Microwave Power Aplication", IEEE Transaction on Electron Devices, vol. 48, No. 3 (Mar. 2001).
Wu et al., "High Al—Content AlGaN/GaN MODFETs for Ultrahigh Performance", IEEE Electron Device Letters, vol. 19, No. 2 (Feb. 1998).
CRC Press, *The Electrical Engineering Handbook*, Second Edition, Dorf, p. 994, (1997).
B. Belmont, K et. al. *Applied Physics*, 74, 1818 (1993).
R. Gaska et al., *Applied Physics Letter*, 72,.707 (1998).
Y.F. Wu et al., *IEICE Trans. Electron*, E–82–C, 1985 (1999).
Y.F. Wu et al., *IEEE Trans. Electron Device*, 48, 586 (2001).
M. Micovic et al., *IEEE Trans. Electron Device*, 48, 591 (2001).

(List continued on next page.)

*Primary Examiner*—Jerome Jackson
*Assistant Examiner*—Joseph Nguyen
(74) *Attorney, Agent, or Firm*—Koppel, Jacobs, Patrick & Heybl

(57) ABSTRACT

A Group III nitride based high electron mobility transistors (HEMT) is disclosed that provides improved high frequency performance. One embodiment of the HEMT comprises a GaN buffer layer, with an $Al_yGa_{1-y}N$ (y=1 or y 1) layer on the GaN buffer layer. An $Al_xGa_{1-x}N$ ($0 \leq x \leq 0.5$) barrier layer on to the $Al_yGa_{1-y}N$ layer, opposite the GaN buffer layer, $Al_yGa_{1-y}N$ layer having a higher Al concentration than that of the $Al_xGa_{1-x}N$ barrier layer. A preferred $Al_yGa_{1-y}N$ layer has y=1 or y~1 and a preferred $Al_xGa_{1-x}N$ barrier layer has $0 \leq x \leq 0.5$. A 2DEG forms at the interface between the GaN buffer layer and the $Al_yGa_{1-y}N$ layer. Respective source, drain and gate contacts are formed on the $Al_xGa_{1-x}N$ barrier layer. The HEMT can also comprising a substrate adjacent to the buffer layer, opposite the $Al_yGa_{1-y}N$ layer and a nucleation layer between the $Al_xGa_{1-x}N$ buffer layer and the substrate.

34 Claims, 3 Drawing Sheets

OTHER PUBLICATIONS

*IEEE Electron Device Letters*, vol. 18, No. 10, Oct. 1997, p. 492.

Ping et al., "DC and Microwave Performance of High Current AlGaN Heterostructure Field Effect Transistors Grown on P–type SiC Substrates" *IEEE Electron Devices Letters.*, vol. 19, No. 2, Feb. 1998, p. 54.

K. Chu et al., WOCSEMMAD, Monterey, CA, Feb. 1998.

G. Sullivan et al., "High Power 10 GHz Operation of AlGaN HFET's in Insulating SiC", *IEEE Electron Device Letters*, vol. 19, No. 6, p. 198, Jun. 1998.

Wu et al., *IEEE Electron Device Letters*, vol. 19, No. 2, p. 50 (Feb. 1998).

Journal of Applied Physics, *Efect of Polarization Fields on Transport Properties in AlGaN/GaN Heterostructures*, Hsu et al.,vol. 89, No. 3, (Feb. 1, 2001) p. 1783–1789.

IEEE Electron Device Letters, *AlGaN/GaN Metal Oxide Semiconductor Heterostructure Field Effect Transistor*, Khan et al., vol. 21, No. 2, (Feb. 2000), p. 63–65.

* cited by examiner

GROUP-III NITRIDE BASED HIGH ELECTRON MOBILITY TRANSISTOR (HEMT) WITH BARRIER/SPACER LAYER

This application claims the benefit of provisional application Ser. No. 60/290,195 to Smorchkova et al., which was filed on May 11, 2001.

This invention was made with Government support under Contract Nos. N00014-96-1-1215 and N00014-99-1-0729, awarded by the ONR and Contract No. F49620-00-1-0143 awarded by AFOSR. The Government has certain rights in this invention.

This invention was made with Government support under Contract No. DE-AC03-76SF00098 awarded by the Director Office of Energy Research, Office of Science, Division of Materials Sciences of the U.S. Department of Energy.

This invention was made with Government support under Contract No. N00014-00-C-0004, awarded by the ONR. The Government has certain rights in this invention.

BACKGROUND OF THE INVENTION

1. Field of the Invention

This invention relates to high frequency solid state transistors, and more particularly to Group-III nitride based high electron mobility transistors (HEMTs).

2. Description of the Related Art

HEMTs are a common type of solid state transistor that are regularly fabricated from semiconductor materials such as Silicon (Si) or Gallium Arsenide (GaAs). One disadvantage of Si is that it has low electron mobility (approximately 1450 $cm^2$/V-s), which produces a high source resistance. This resistance can degrade the Si based HEMT's high performance gain. [CRC Press, *The Electrical Engineering Handbook*, Second Edition, Dorf, p.994, (1997)]

GaAs based HEMTs have become the standard for signal amplification in civil and military radar, handset cellular, and satellite communications. GaAs has a higher electron mobility (approximately 6000 $cm^2$/V-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing of AlGaN/GaN semiconductor materials have focused interest on the development of AlGaN/GaN HEMTs for high frequency, high temperature and high power applications. AlGaN/GaN has large bandgaps, high peak and saturation electron velocity values [B. Belmont, K. Kim and M. Shur, *J.Appl.Phys.* 74, 1818 (1993)]. AlGaN/GaN HEMTs can also have 2DEG sheet densities in excess of $10^{13}/cm^2$ and relatively high electron mobility (up to 2019 $cm^2$/Vs) [R. Gaska, J. W. Yang, A. Osinsky, Q. Chen, M. A. Khan, A. O. Orlov, G. L. Snider and M. S. Shur, *Appl.Phys.Lett.*, 72, 707 (1998)]. These characteristics allow AlGaN/GaN HEMTs to provide high power at higher frequencies.

AlGaN/GaN HEMTs have been grown on sapphire substrates and have shown a power density of 4.6 W/mm and a total power of 7.6 W [Y. F. Wu et al., *IEICE Trans.Electron.*, E-82-C, 1895 (1999)]. More recently, AlGaN/GaN HEMTs grown on SiC have shown a power density of 9.8 W/mm at 8 GHz [Y. F. Wu, D. Kapolnek, J. P. Ibbetson, P. Parikh, B. P. Keller and U. K. Mishra, *IEEE Trans.Electron.Dev.*, 48, 586 (2001)] and a total output power of 22.9 at 9 GHz [M. Micovic, A Kurdoghlian, P. Janke, P. Hashimoto, D. W. S. Wong, J. S. Moon, L. McCray and C. Nguyen, *IEEE Trans.Electron.Dev.*, 48, 591 (2001)].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., "High-Temperature Performance of AlGaN/GaN HFET's on SiC Substrates," *IEEE Electron Device Letters*, Vol. 18, No 10, October 1997, Page 492; and Ping et al., "DC and Microwave Performance of High Current AlGaN Heterostructure Field Effect Transistors Grown on P-type SiC Substrates," *IEEE Electron Devices Letters*, Vol. 19, No. 2, February 1998, Page 54. Some of these devices have shown a gain-bandwidth product ($f_T$) as high as 67 gigahertz [K. Chu et al. WOCSEMMAD, Monterey, Calif. (February 1998)] and high power densities up to 2.84 W/mm at 10 GHz [G. Sullivan et al., "High Power 10-GHz Operation of AlGaN HFET's in Insulating SiC," *IEEE Electron Device Letters*, Vol. 19, No. 6, Page 198 (June 1998); and Wu et al., IEEE Electron Device Letters, Volume 19, No. 2, Page 50 (February 1998)].

FIG. 1, shows a typical AlGaN/GaN HEMT 10 that comprises a GaN buffer layer 11 adjacent to a sapphire or silicon carbide substrate 12 and a $Al_xGa_{1-x}N$ ($x \approx 0.1$–$0.5$) layer 13 adjacent to the GaN buffer layer 11, opposite the substrate 12. A nucleation layer 14 can be included between the substrate 12 and the GaN buffer layer 11, to reduce the lattice mismatch between the two layers. The HEMT 10 also includes source, gate and drain contacts 15, 16, 17. The Al content in the $Al_xGa_{1-x}N$ creates a piezoelectric charge that accumulates at the interface with the GaN layer to form a two-dimensional electron gas (2DEG) 18. As the Al content in the $Al_xGa_{1-x}N$ layer is increased, the piezoelectric charge is also increased, which results in a beneficial increase the HEMT's 2DEG and transconductance.

However, the 2DEG's mobility is generally limited by the interface roughness and piezoelectric scattering at the interface between the GaN and $Al_xGa_{1-x}N$ layers 11, 13, which are the result of localized randomness in the $Al_xGa_{1-x}N$ layer 13 near the interface.

By substituting an $Al_yGa_{1-y}N$ (y=1 or y$\approx$1) layer for the $Al_xGa_{1-x}N$ (x$\approx$0.1–0.5) layer 13, certain advantages can be achieved. The 2.4% lattice mismatch between AlN ($Al_yGa_{1-y}N$ for y=1) and GaN results in the maximum possible piezoelectric charge at the interface between the two layers. Using an AlN layer also reduces the piezoelectric scattering between the layers that can limit the 2DEG mobility.

However, the high lattice mismatch between AlN and GaN dictates that the thickness of the AlN layer should be less than 50 Å. If the layer is thicker, the device can experience problems with its ohmic contacts, the material quality in the layer begins to degrade, the device's reliability decreases, and the material is more difficult to grow. However, a HEMT with a 50 Å or less AlN layer is susceptible to high gate leakage.

SUMMARY OF THE INVENTION

The present invention provides improved Group-III nitride based HEMTs with improved 2DEG mobility that are preferably formed of AlGaN/GaN. A HEMT constructed in accordance with the present invention comprises a GaN buffer layer with an $Al_yGa_{1-y}N$ layer on the GaN buffer layer. An $Al_xGa_{1-x}N$ barrier layer is included on the $Al_yGa_{1-y}N$ layer opposite the GaN buffer layer, the $Al_yGa_{1-y}N$ layer having a higher Al content than the $Al_xGa_{1-x}N$ barrier layer.

A 2DEG at formed the interface between the GaN buffer layer and the $Al_yGa_{1-y}N$ layer. A preferred $Al_yGa_{1-y}N$ layer has y=1 or y≈1, and a preferred $Al_xGa_{1-x}N$ barrier layer has 0≦x≦0.5.

The HEMT also has respective source, drain and gate contacts contacting its $Al_xGa_{1-x}N$ barrier layer. The HEMT can also be formed on a substrate made from a material from the group consisting of sapphire, silicon carbide, gallium nitride and silicon. The substrate is arranged adjacent to the buffer layer, opposite the $Al_yGa_{1-y}N$ layer. The HEMT can also have a nucleation layer between its GaN buffer layer and substrate The HEMT's $Al_yGa_{1-y}N$ layer on the GaN layer provides a high piezoelectric charge and a reduction in piezoelectric scattering at the interface between the two layers. The $Al_yGa_{1-y}N$ layer should be relatively thin because of the high lattice mismatch between AlN and GaN. The $Al_xGa_{1-x}N$ layer on the thin $Al_yGa_{1-y}N$ layer keeps the HEMT's gate leakage low.

These and other further features and advantages of the invention would be apparent to those skilled in the art from the following detailed description, taking together with the accompanying drawings, in which:

DETAILED DESCRIPTION OF THE INVENTION

Figure 1:
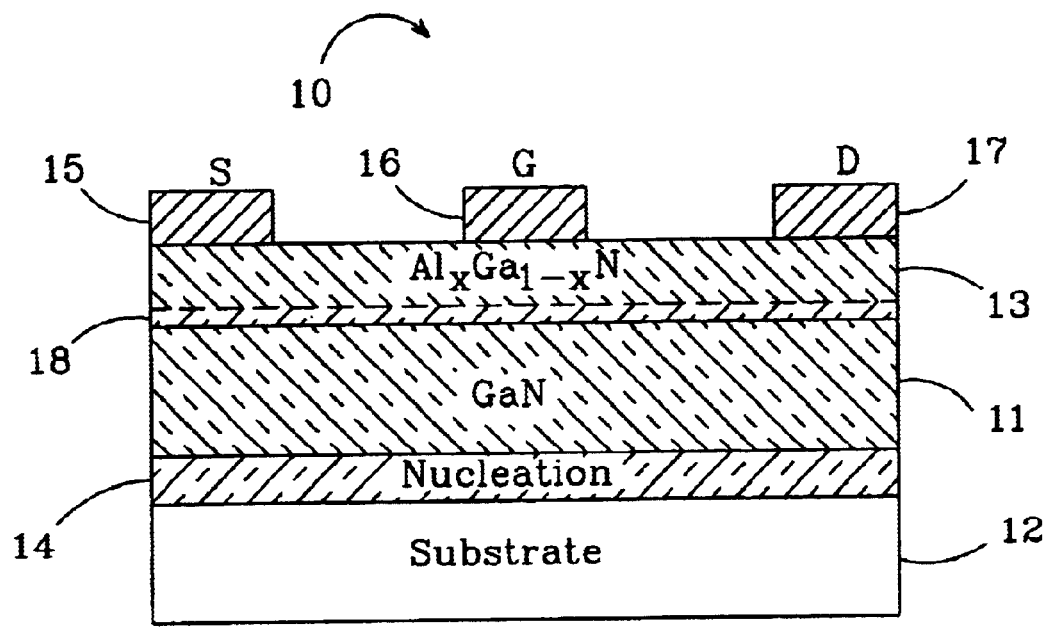
FIG. 1 is a sectional view of a prior art AlGaN/GaN HEMT.
Figure 2:
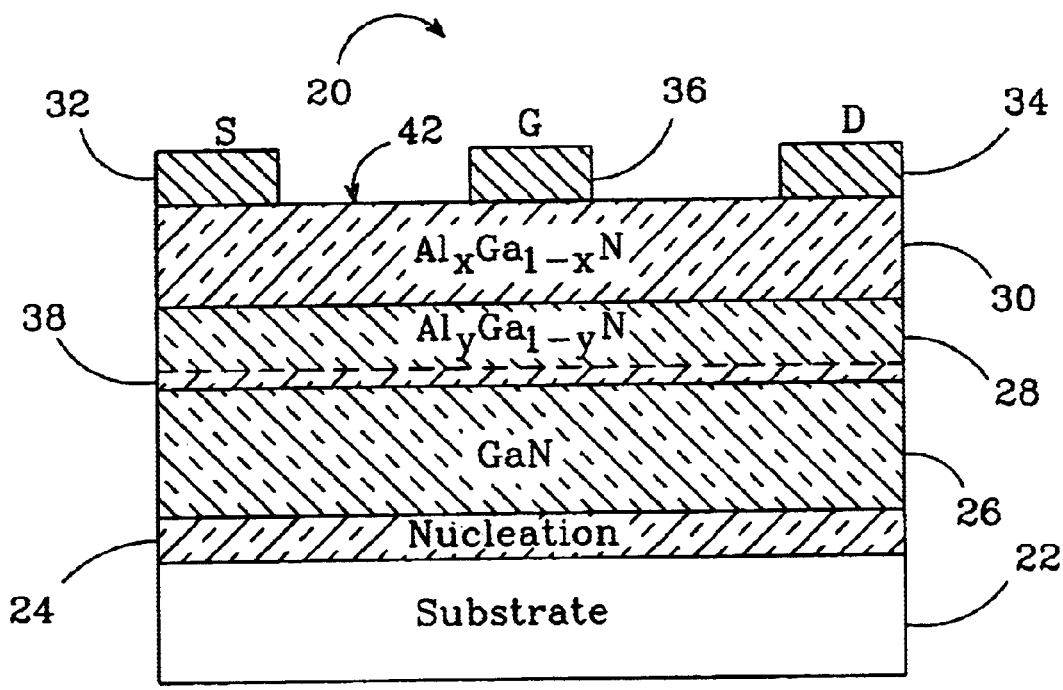
FIG. 2 is a sectional view of an embodiment of an AlGaN/GaN HEMT according to the present invention.

FIG. 2 shows one embodiment of a HEMT 20 constructed in accordance with the present invention. It comprises a substrate 22 that can be made of different materials such as sapphire ($Al_2O_3$), silicon carbide (SiC), gallium nitride (GaN), or silicon (Si). The preferred substrate is a 4H polytype of silicon carbide. Other silicon carbide polytypes can also be used including 3C, 6H and 15R polytypes.

Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree Research, Inc., of Durham, N.C. and methods for producing them are set forth in the scientific literature as well as in a U.S. Pat. Nos. Re. 34,861; 4,946,547; and 5,200,022.

The new HEMT 20 can be fabricated using many different material systems but is preferably fabricated using Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. The spontaneous and piezoelectric polarization in wurtzite group III-nitrides are found to be approximately 10 times larger than in conventional Group III-V and II-VI semiconductor compounds.

A nucleation layer 24 can be included on the substrate 22 to reduce the lattice mismatch between the substrate 22 and the next layer in the HEMT 20. The nucleation layer 24 should be approximately 1000 angstroms (Å) thick, although other thicknesses can be used. It can be made of different semiconductor materials with one suitable material being $Al_zGa_{1-z}N$ (0≦z≦1) that is preferably AlN ($Al_zGa_{1-z}N$ for z=1).

A GaN layer 26 is included on the nucleation layer 24, opposite the substrate 22. The GaN layer 26 should be in the range of approximately 0–5 μm thick, although other thicknesses can be used. In one of the preferred embodiments of the HEMT 20, the GaN layer 26 is 2 μm thick. Alternatively, the GaN layer 26 can be made of $Al_wGa_{1-w}N$ (0≦w≦1).

An $Al_yGa_{1-y}N$ (y=1 or y≈1) layer 28 is included on the GaN layer 26, opposite the nucleation layer 24. The layer 28 should be less than 50 Å thick, but in different arrangement other thicknesses can be used. The preferred thickness is approximately 20 Å. The ($Al_yGa_{1-y}N$ for y=1) layer 28 can be formed of multiple monolayers of AlN, with each monolayer being in the range of approximately 5–20 Å thick. For example, a layer 28 formed of 4 monolayers that are 5 Å thick would be 20 Å thick.

An $Al_xGa_{1-x}N$ barrier layer 30 is included on the $Al_yGa_{1-y}N$ layer 28, opposite the GaN layer 26. The preferred composition of the layer 30 is with 0≦x≦0.5, although the composition can be varied, with x being between 0 and 1. Layer 30 should be in the range of approximately 100 to 1000 Å thick, although other thicknesses can be used. The thickness of the layer 30 is dependent upon the layer's Al composition, the higher the Al composition the thinner the layer 30 can be. In one embodiment of the HEMT 20, the layer 30 is approximately 300 Å thick and has a composition of $Al_xGa_{1-x}N$ (x≈0.33). If the barrier layer is too thin (less than approximately 100 Å) the layer 30 does not produce an effective 2DEG in the HEMT 20.

The HEMT 20 includes source, drain and gate contacts 32, 34, 36. The source and drain contacts 32, 34 can be made of different materials including but not limited to alloys of titanium, aluminum, or nickel. The gate cantact 36 can also be made of different materials including but not limited to titanium, platinum, chromium, alloys of titanium and tungsten, or platinum silicide.

A 2DEG 38 forms at the junction between the $Al_yGa_{1-y}N$ layer 28 and the GaN layer 26. As described above, the 2.4% lattice mismatch between AlN ($Al_yGa_{1-y}N$ for y=1) layer 28 and GaN layer 26 results in the maximum possible piezoelectric charge at the interface between the two layers. The AlN ($Al_yGa_{1-y}N$ for y=1) layer 28 also reduces the piezoelectric scattering between the layers that can limit the 2DEG mobility.

By having a AlN ($Al_yGa_{1-y}N$ for y=1) layer 28 on the GaN layer 26, the HEMT's 2DEG 38 has increased mobility. By having a thicker $Al_xGa_{1-x}N$ 30 on the AlN ($Al_yGa_{1-y}N$ for y=1) layer 28 the HEMT 20 does not experience the high gate leakage that would be experienced by having only the AlN ($Al_yGa_{1-y}N$ for y=1) layer 28.

A HEMT 20 according to the present invention, having a 20 Å $Al_yGa_{1-y}N$ layer (y=1) with a 200 Å $Al_xGa_{1-x}N$ (x=0.25) layer on it, can have a 2DEG density of $7.45 \times 10^{12}/cm^2$ and a mobility of 2195 $cm^2/Vs$. A HEMT 20 having a 20 Å $Al_yGa_{1-y}N$ layer (y=1) with a 230 Å $Al_xGa_{1-x}N$ (x=0.33) layer on it, can have a 2DEG density of $1.10 \times 10^{13}/cm^2$ and a mobility of 2082 $cm^2/Vs$. The 2DEG sheet density increases as the aluminum composition of the $Al_xGa_{1-x}N$ barrier layer increases.

Figure 3:
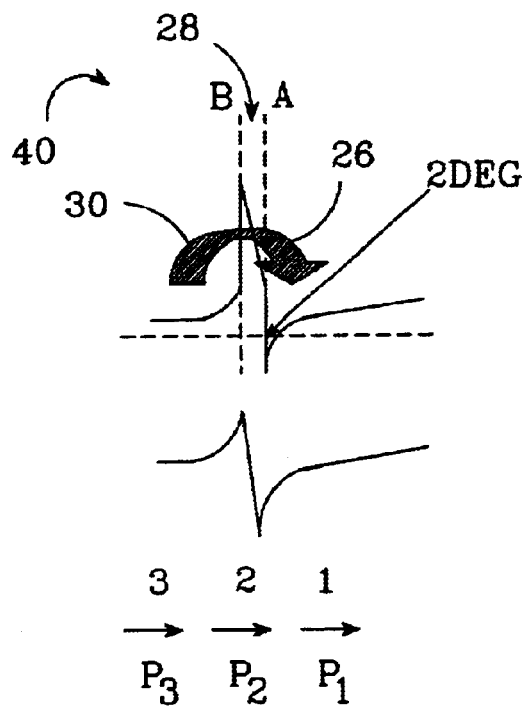
FIG. 3 is a band diagram of the AlGaN/GaN HEMT shown in FIG. 2.

FIG. 3 shows a band diagram 40 for the HEMT 20 in FIG. 2, taken at point 42 and vertically through the $Al_xGa_{1-x}N$ barrier layer 30, $Al_yGa_{1-y}N$ layer 28, the 2DEG 32 and the GaN layer 26. Each of the layers 26, 28 and 30 has a respective non-zero total polarization $P_1$, $P_2$ and $P_3$ pointing in the same direction. The magnitude of the total polarization in the $Al_yGa_{1-y}N$ layer 28 is higher than the surrounding layers 26 and 30 because of its increased Al content. This gradient of polarization results in polarization induced sheet charges at interfaces A and B between the three layers. A positive polarization sheet charge is located at the interface A between layers GaN layer 26 and the $Al_yGa_{1-y}N$ layer 28. A negative polarization sheet charge is located at the interface between $Al_xGa_{1-x}N$ barrier layer 30 and the $Al_yGa_{1-y}N$ layer 28. There is a resulting non-zero electric field in the $Al_yGa_{1-y}N$ layer 28. As a result, the conduction band edge of $Al_xGa_{1-x}N$ barrier layer 30 at the interface B with $Al_yGa_{1-y}N$ layer 28 is positioned above the conduction band edge of GaN layer 26. The middle layer 28 is relatively thin and is almost transparent to electrons even if the conduction band discontinuities between the layers are relatively large. As a result, electrons can transfer from the top layer into the bottom layer and form a 2DEG channel at the interface A between layers 26 and 28. This staggered bandgap can be achieved between layers of the same semiconductor material by changing the element compositions in the layers.

Figure 4:
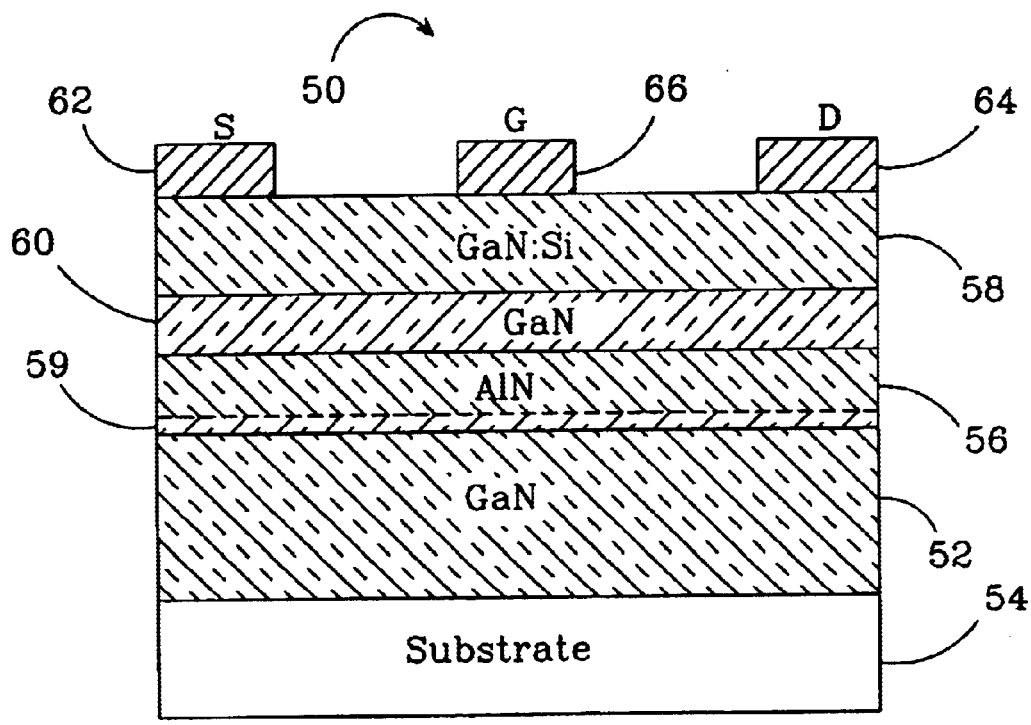
FIG. 4 is a sectional view of a second embodiment of an AlGaN/GaN HEMT according to the present invention.

FIG. 4 shows another embodiment of a HEMT 50 fabricated pursuant to the present invention that is also made from Group III-nitride semiconductor materials. An unintentionally doped or semi-insulating GaN buffer layer 52 is formed on a sapphire substrate 54. A relatively thin (~1 nm) AlN layer 56 is formed on top of GaN buffer layer 52 and then capped with Si-doped GaN layer 58. The surface of the AlN layer 56 is GaN-terminated 60, so that spontaneous polarization in all the layers points toward the substrate 54. In addition, the piezoelectric polarization in the layers points in the same direction as the spontaneous polarization. The magnitude of both spontaneous and piezoelectric polarization increases with Al concentration of the layers and the AlN layer 56 has the highest Al concentration and the highest total polarization. The staggered bandgap line-up shown in FIG. 3 is achieved between the HEMT's layers with a 2DEG 59 formed at the interface between the AlN layer and the GaN layer. The HEMT 50 also includes source, drain and gate contacts 62, 64, 66.

HEMT structures according to the present invention can be fabricated using all Group III nitrides and their alloys with P, As and Sb can also be used. The sequence of the layers should be such that the gradient of polarization results in a strong electric field in the very thin layer in the middle. The HEMTs can be fabricated using different processes including but not limited to, metallorganic chemical vapor deposition (MOCVD), molecular beam epitaxy (MBE) or vapor-phase epitaxy (VPE). The $Al_xGa_{1-x}N$ barrier layer 30 and the $Al_yGa_{1-y}N$ layer 28 can be grown in hydrogen, nitrogen or ammonia carrier gasses.

Figure 5:
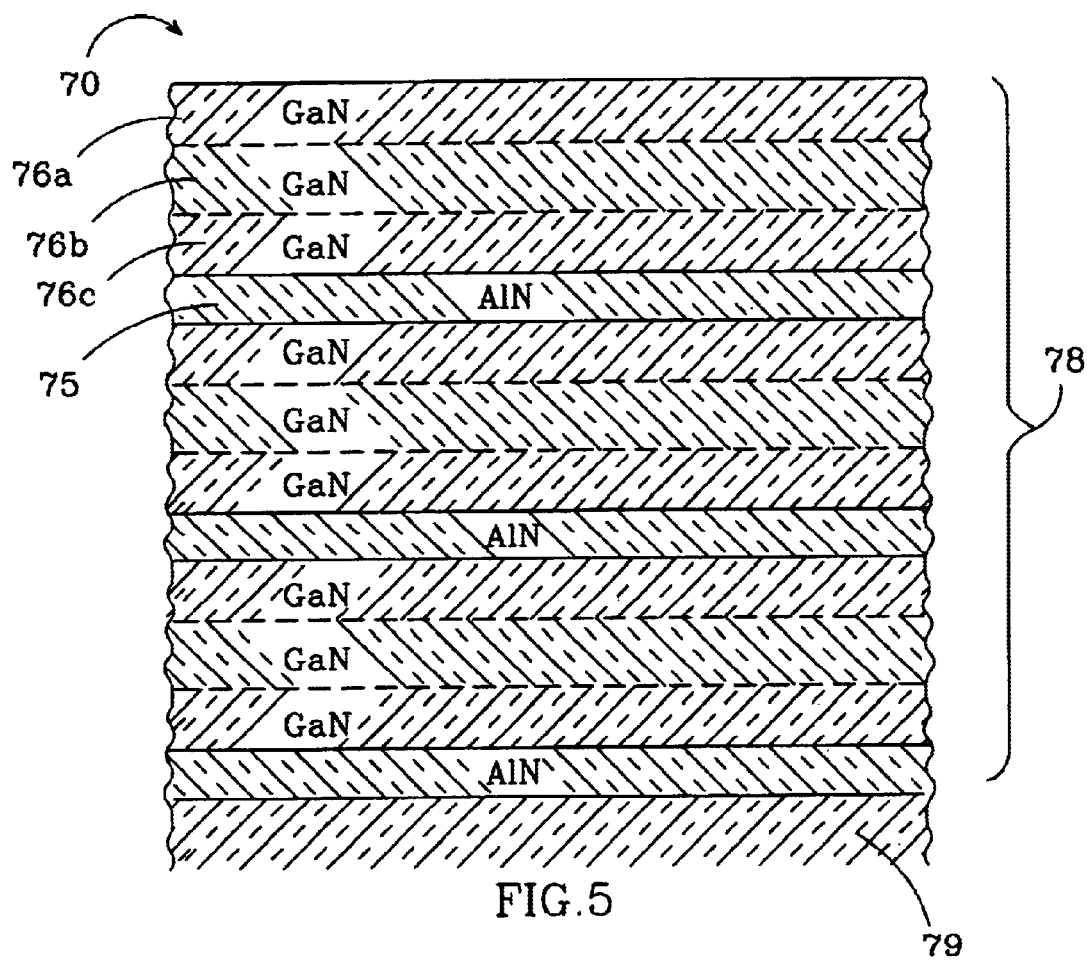
FIG. 5 is a sectional view of the barrier layer in the HEMT of FIG. 2, that is fabricated using a digital method.

FIG. 5 shows a HEMT 70 with an $Al_xGa_{1-x}N$ barrier layer 78 and an $Al_yGa_{1-y}N$ layer 79 that are similar to same layers 30 and 28 in the HEMT 20 in FIG. 2. However, in this embodiment, the barrier layer 78 is fabricated in a digital fashion to obtain the desired Al and Ga concentrations. The barrier layer 78 can have multiple layer sets of 4 layers per set, wherein one is an AlN layer 75 and three are GaN layers 76a–c. A barrier layer 72 with four layer sets, has four Al layers 75 and twelve GaN layers 76a–c. This results in the concentration of the overall barrier layer of 25% Al and 75% GaN. Similarly, a concentration of 33% Al and 67% GaN can be achieved by each layer set having 3 layers, with one Al layer and two GaN layers.

By fabricating the barrier layer 78 using this method, the flow rates of the different gasses do not need to be finely adjusted to achieve the desired Al and CaN concentrations. This process also leads to a barrier layer 78 having a concentration of the materials is more exact and results in uniformity of material concentrations throughout the barrier layer 78. The barrier layer 78 can be terminated with either a GaN or AlN layer. This process can also be used to fabricate other HEMT layers.

Figure 6:
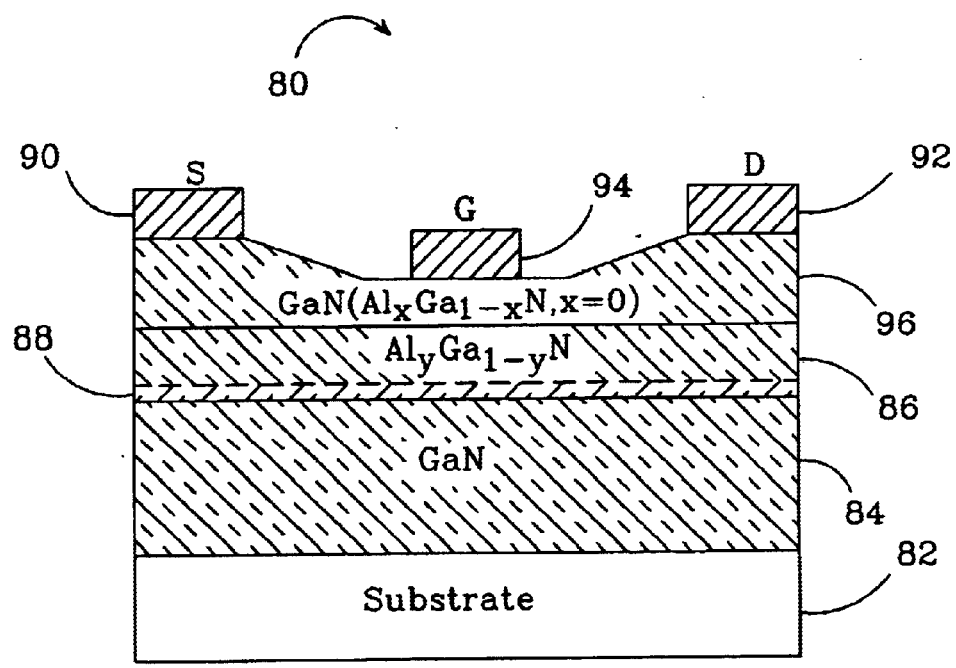
FIG. 6 is a sectional view of a third embodiment of a HEMT according to the present invention, with the barrier layer having a recessed gate structure.

FIG. 6 shows another embodiment of a HEMT 80 constructed in accordance with the present invention. It has a substrate 82, GaN buffer layer 84, $Al_yGa_{1-y}N$ (y=1 or y≈1) layer 86, 2DEG 88, source contact 90, drain contact 92 and gate contact 94, that are all similar to those in the HEMT 20 shown in FIG. 2. However, in this embodiment, the barrier layer 96 is comprised of GaN ($Al_xGa_{1-x}N$ with x=0) The barrier layer 96 can be n-type, either in a uniform or delta doped scheme. With this composition the barrier layer 96 can be made thick (500–1000 Å), which can enable recessed gate structures. In a standard planar HEMT structure the resistance under the gate, drain and source contacts are equivalent. By making the barrier layer 96 thicker, the resistance under each is reduced. However, it is desirable to have an increased resistance under the gate contacts 94 while keeping a low resistance under the source and drain contacts 90 and 92. The thick barrier layer 96 can be etched so it is thinner under gate contact 94. This increases the resistance under the gate contact 94 while keeping the resistance under the source and drain contacts 90 and 92 to a minimum.

We claim:

1. A high electron mobility transistor (HEMT), comprising:

a GaN buffer layer;

an $Al_yGa_{1-y}N$ (y>0.5) layer on said GaN buffer layer;

an $Al_xGa_{1-x}N$ barrier layer on said $Al_yGa_{1-y}N$ layer opposite said GaN buffer layer, said $Al_yGa_{1-y}N$ layer having a higher Al content than said $Al_xGa_{1-x}N$ barrier layer; and a 2DEG at the interface between said GaN buffer layer and said $Al_yGa_{1-y}N$ layer.

2. The HEMT of claim 1, wherein said $Al_yGa_{1-y}N$ layer comprises $Al_yGa_{1-y}N$ (y=1 or y≈1).

3. The HEMT of claim 1, wherein said $Al_xGa_{1-x}N$ barrier layer comprises $AL_xGa_{1-x}N$ (0≤x≤0.5).

4. The HEMT of claim 1, further comprising respective source, drain and gate contacts on said $Al_xGa_{1-x}N$ barrier layer.

5. The HEMT of claim 1, further comprising a substrate adjacent to said buffer layer, opposite said $Al_yGa_{1-y}N$ layer, said substrate made from a material from the group consisting of sapphire, silicon carbide, gallium nitride and silicon.

6. The HEMT of claim 1, further comprising a nucleation layer between said GaN buffer layer and said substrate.

7. The HEMT of claim 4, wherein said source and drain contacts are made of an alloy from the group consisting of titanium, aluminum, and nickel.

8. The HEMT of claim 4, wherein said gate made of a material from the group consisting of titanium, platinum, chromium, alloys of titanium and tungsten, and platinum silicide.

9. The HEMT of claim 1, wherein said GaN buffer layer is less than approximately 5 $\mu$m thick.

10. The HEMT of claim 1, wherein said $Al_yGa_{1-y}N$ layer is less than approximately 50 Å thick.

11. The HEMT of claim 1, wherein said $Al_xGa_{1-x}N$ barrier layer is approximately 100 to 1000 Å thick.

12. The HEMT of claim 4, wherein the resistance under said gate contact is greater than the resistance under said source and drain contacts.

13. The HEMT of claim 4, wherein said barrier layer is thinner under said gate contact.

14. The HEMT of claim 1, wherein said layers can be fabricated digitally.

15. A group III nitride based high electron mobility transistor (HEMT), comprising:
a semiconductor buffer layer;
a high polarization semiconductor layer on said buffer layer;
a semiconductor barrier layer on said high polarization layer so that said high polarization layer is sandwiched between said buffer and barrier layers, each of said layers having a non-zero total polarization pointing in the same direction, the magnitude of said polarization in said high polarization layer higher than the polarization of said buffer and barrier layers; and
a two dimensional electron gas at the interface between said buffer layer and said high polarization layer.

16. The HEMT of claim 15, further comprising respective source, drain and gate contacts that contact said barrier layer.

17. The HEMT of claim 15, further comprising a substrate adjacent to said buffer layer, opposite said high polarization layer, said substrate made from a material from the group consisting of sapphire, silicon carbide, gallium nitride and silicon.

18. The HEMT of claim 15, further comprising a nucleation layer between said buffer layer and said substrate.

19. The HEMT of claim 15, wherein said buffer layer is made of GaN.

20. The HEMT of claim 15, wherein said buffer layer is less than 5 $\mu$m thick.

21. The HEMT of claim 15, wherein said high polarization semiconductor layer is made of $Al_yGa_{1-y}N$ (y=1 or y$\approx$1).

22. The HEMT of claim 15, wherein said high polarization layer is less than 50 Å thick.

23. The HEMT of claim 15, wherein said barrier layer made of $Al_xGa_{1-x}N$ (0$\leq$x$\leq$0.5).

24. The HEMT of claim 15, wherein said barrier layer is 100 to 1000 Å thick.

25. A high electron mobility transistor (HEMT), comprising:
a bottom layer of Group III nitride semiconductor material;
a middle layer of Group III nitride semiconductor material on said bottom layer, wherein said middle layer can comprise one or more Group III elements one of which is Al;
a top layer of Group III nitride semiconductor material on said middle layer, opposite said bottom layer, wherein said top layer can comprise one or more Group III elements, said middle layer having Al concentration that is higher than 50% and said Al in said middle layer also having a concentration that is higher than the concentration of any Al in said top layer; and
a 2DEG at the interface between said middle and bottom layer.

26. The HEMT of claim 25, further comprising respective source, drain and gate contacts that contact said top layer.

27. The HEMT of claim 25, further comprising a substrate adjacent to said bottom layer, opposite said top layer.

28. The HEMT of claim 25, further comprising a nucleation layer between said bottom layer and said substrate.

29. The HEMT of claim 25, wherein said bottom layer is made of GaN and is less than 5 $\mu$m thick.

30. The HEMT of claim 25, wherein said middle layer is made of $Al_yGa_{1-y}N$ (y=1 or y$\approx$1) and is less than 50 Å thick.

31. The HEMT of claim 25, wherein said barrier layer made of $Al_xGa_{1-x}N$ (0$\leq$x$\leq$0.5) and is 100 to 1000 Å thick.

32. The HEMT of claim 26, wherein the resistance under said gate contact is greater than the resistance under said source and drain contacts.

33. The HEMT of claim 26, wherein said barrier layer is thinner under said gate contact.

34. The HEMT of claim 25, wherein said layers can be fabricated digitally.

* * * * *

UNITED STATES PATENT AND TRADEMARK OFFICE
CERTIFICATE OF CORRECTION

PATENT NO. : 6,849,882 B2
DATED : February 1, 2005
INVENTOR(S) : Chavarkar et al.

It is certified that error appears in the above-identified patent and that said Letters Patent is hereby corrected as shown below:

Title page,
Item [73], Assignee, should read:
-- Cree, Inc. Goleta, CA (US);
The Regents of the University of California, Oakland, CA (US) --.

Signed and Sealed this

Twentieth Day of December, 2005

JON W. DUDAS
*Director of the United States Patent and Trademark Office*